(12) United States Patent
Hashimoto

(10) Patent No.: US 12,263,539 B2
(45) Date of Patent: Apr. 1, 2025

(54) MANUFACTURING METHODS OF WAFER AND CHIPS AND POSITION ADJUSTMENT METHOD OF LASER BEAM

(71) Applicant: DISCO CORPORATION, Tokyo (JP)

(72) Inventor: Kazuki Hashimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 429 days.

(21) Appl. No.: 17/653,371

(22) Filed: Mar. 3, 2022

(65) Prior Publication Data
US 2022/0288722 A1 Sep. 15, 2022

(30) Foreign Application Priority Data
Mar. 9, 2021 (JP) .................................. 2021-037482

(51) Int. Cl.
*B23K 26/364* (2014.01)
*B23K 101/40* (2006.01)
(Continued)

(52) U.S. Cl.
CPC ...... *B23K 26/364* (2015.10); *H01L 21/02013* (2013.01); *H01L 21/76894* (2013.01); *B23K 2101/40* (2018.08)

(58) Field of Classification Search
CPC ......... H10D 89/011–015; B28D 5/0005–0052; H01L 21/782; H01L 21/784; H01L 21/786; B23K 26/00–70
See application file for complete search history.

(56) References Cited

U.S. PATENT DOCUMENTS

| | | | |
|---|---|---|---|
| 2014/0248757 A1* | 9/2014 | Morikazu | ............... H01L 21/78 438/463 |
| 2016/0163597 A1* | 6/2016 | Yamashita | ............... H01L 21/78 438/462 |

(Continued)

FOREIGN PATENT DOCUMENTS

| | | |
|---|---|---|
| JP | 2007173475 A | 7/2007 |
| JP | 2012243927 A | 12/2012 |

(Continued)

OTHER PUBLICATIONS

Search report issued in counterpart Singapore patent application No. 10202202189Q, dated Jun. 28, 2023.
(Continued)

*Primary Examiner* — Evren Seven
*Assistant Examiner* — Cole Leon Lindsey
(74) *Attorney, Agent, or Firm* — Greer Burns & Crain Ltd.

(57) ABSTRACT

There is provided a manufacturing method of a wafer. The manufacturing method of a wafer includes a preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, and a laser processed groove forming step of forming laser processed grooves along the planned dividing lines through executing irradiation with a first laser beam with a wavelength having absorbability with respect to the stacked body, along the planned dividing lines from the side of the stacked body of the wafer.

15 Claims, 10 Drawing Sheets

(51) Int. Cl.
    *H01L 21/02*     (2006.01)
    *H01L 21/768*     (2006.01)

(56) References Cited

U.S. PATENT DOCUMENTS

| | | |
|---|---|---|
| 2016/0172203 A1 | 6/2016 | Ono et al. |
| 2019/0229005 A1 | 7/2019 | Tanaka et al. |

FOREIGN PATENT DOCUMENTS

| | | | |
|---|---|---|---|
| JP | 2013254867 A | 12/2013 | |
| JP | 2017045965 A | 3/2017 | |
| JP | 2019140326 A | 8/2019 | |

OTHER PUBLICATIONS

Office Action issued in counterpart German patent application No. 10 2022 202 126.6, dated Dec. 12, 2023.

Office Action issued in counterpart Japanese patent application No. 2021-037482, dated Dec. 24, 2024.

\* cited by examiner

MANUFACTURING METHODS OF WAFER AND CHIPS AND POSITION ADJUSTMENT METHOD OF LASER BEAM

BACKGROUND OF THE INVENTION

Field of the Invention

The present invention relates to a wafer, a manufacturing method of the wafer, a manufacturing method of chips in which the wafer is divided to manufacture the chips, and a position adjustment method of a laser beam used for processing of the wafer.

Description of the Related Art

For manufacturing of chips incorporated into various pieces of electronic equipment such as mobile phones and personal computers, a wafer in which a device is formed in each of plural regions marked out by plural planned dividing lines (streets) intersecting each other is used. By dividing this wafer along the planned dividing lines, plural chips (device chips) each including the device are obtained.

A cutting apparatus that cuts a workpiece by an annular cutting blade is used for the dividing of the wafer. Meanwhile, in recent years, development of a method of dividing a wafer by laser processing has also been being advanced. A laser processing apparatus including a chuck table that holds a workpiece and a laser irradiation unit that irradiates the workpiece with a laser beam is used for the laser processing of the wafer. For example, while the laser beam with a wavelength having transmissibility with respect to the wafer is focused inside the wafer, scanning with the laser beam is executed along the planned dividing lines. Thus, modified layers are formed inside the wafer along the planned dividing lines. Some regions in which the modified layers are formed in the wafer become more fragile than the other regions. Accordingly, when an external force is given to the wafer in which the modified layers are formed, the modified layers function as the origin of dividing, and the wafer is divided along the planned dividing lines.

The wafer used for the manufacturing of the device chips includes a substrate composed of a semiconductor material such as silicon and a stacked body formed on the front surface side of the substrate. The stacked body has a structure obtained by stacking various kinds of thin films such as an electrically-conductive film that functions as an electrode and an insulating film (for example, low dielectric constant insulating film (Low-k film)) that functions as an interlayer insulating film. By forming the stacked body on the front surface side of the substrate, semiconductor devices, a test element group (TEG) for executing inspection of the semiconductor devices, and so forth are configured.

Note that, if the stacked body remains on the planned dividing lines when the wafer is divided, the remaining stacked body hinders the dividing of the wafer in some cases. Thus, treatment of splitting the stacked body along the planned dividing lines is executed in advance by laser processing before the dividing of the wafer (refer to Japanese Patent Laid-open No. 2007-173475). This facilitates proper dividing of the wafer and can prevent separation of the thin film included in the stacked body and damage to the device at the time of the dividing of the wafer.

The splitting of the stacked body is executed by irradiating the stacked body with a laser beam and forming grooves (laser processed grooves) with a depth that reaches the substrate. At this time, not only the stacked body but also the front surface side of the substrate are irradiated with the laser beam, and a processing mark is often formed in the substrate. In this case, there is a fear that the processing mark remains in a device chip obtained through the dividing of the wafer and that the flexural strength (bending strength) of the device chip lowers. Thus, a method has been proposed in which the laser processed grooves with a depth that does not reach the substrate are formed in the stacked body such that the stacked body is prevented from being completely split, and the laser processed grooves are used as the origin of dividing of the stacked body (refer to Japanese Patent Laid-open No. 2013-254867). Using this method can avoid formation of a processing mark in the substrate and prevent the lowering of the flexural strength of the device chip.

SUMMARY OF THE INVENTION

After the laser processed grooves are formed in the stacked body as described above, modified layers are formed inside the substrate by irradiation with a laser beam, and the wafer is divided. Note that, when the modified layers are formed, irradiation with the laser beam is executed from the back surface side of the substrate, so that the stacked body formed on the front surface side of the substrate does not inhibit the irradiation with the laser beam. Thus, the substrate is disposed in such a manner that the front surface side (stacked body side) faces a holding surface of a chuck table and that the back surface side is exposed upward. Further, for properly dividing the wafer, it is required to form the modified layers at positions that overlap with the laser processed grooves formed in the stacked body. Thus, before the substrate is irradiated with the laser beam, position adjustment (alignment) between the substrate and the laser beam is executed such that scanning with the laser beam is executed along the laser processed grooves.

In general, in the case in which the front surface side (stacked body side) of the substrate is held by a chuck table, the substrate is imaged from the back surface side by an infrared camera, and the laser processed groove formed in the stacked body is observed through the substrate. Then, the position of the chuck table is adjusted based on the position of the laser processed groove. However, when the laser processed grooves with a depth that does not reach the substrate are formed as described above, part of the stacked body (remaining part) remains between the substrate and the laser processed groove, and the imaging of the laser processed groove is hindered by the remaining part. As a result, the observation of the laser processed groove may be impossible, and it becomes difficult to execute the alignment.

The present invention is made in view of such a problem and intends to provide a wafer, a manufacturing method of the wafer, a manufacturing method of chips in which the wafer is divided to manufacture the chips, and a position adjustment method of a laser beam used for processing of the wafer that allow proper adjustment of the irradiation position of a laser beam while suppressing lowering of the strength of the chip.

In accordance with an aspect of the present invention, there is provided a manufacturing method of a wafer. The manufacturing method of a wafer includes a preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, and a laser processed groove forming step of forming laser processed grooves along the planned dividing lines through executing irradiation with a first laser beam with a wavelength having absorbability with respect to the stacked body, along the planned dividing lines from the side of the stacked body of the wafer. An irradiation condition of the first laser beam is set to cause melting of the stacked body to occur more readily in the outer circumferential surplus region than in the device region.

Preferably, the energy density of the first laser beam with which the outer circumferential surplus region is irradiated is higher than the energy density of the first laser beam with which the device region is irradiated. Further, preferably, the peak power of the first laser beam with which the outer circumferential surplus region is irradiated is higher than the peak power of the first laser beam with which the device region is irradiated. Moreover, preferably, the overlap rate of the first laser beam with which the outer circumferential surplus region is irradiated is higher than the overlap rate of the first laser beam with which the device region is irradiated.

In accordance with another aspect of the present invention, there is provided a manufacturing method of a wafer. The manufacturing method of a wafer includes a preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, and a laser processed groove forming step of forming laser processed grooves along the planned dividing lines through executing irradiation with a first laser beam with a wavelength having absorbability with respect to the stacked body, along the planned dividing lines from the side of the stacked body of the wafer. The laser processed grooves formed in the outer circumferential surplus region are deeper than the laser processed grooves formed in the device region.

Preferably, the laser processed grooves with a depth that does not reach the substrate are formed in the device region, and the laser processed grooves with a depth that reaches the substrate are formed in the outer circumferential surplus region.

In accordance with a further aspect of the present invention, there is provided a manufacturing method of chips. The manufacturing method of chips includes a preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, and a laser processed groove forming step of forming laser processed grooves along the planned dividing lines through executing irradiation with a first laser beam with a wavelength having absorbability with respect to the stacked body, along the planned dividing lines from the side of the stacked body of the wafer. The manufacturing method of chips also includes a modified layer forming step of forming, after executing the laser processed groove forming step, modified layers along the planned dividing lines through positioning the focusing position of a second laser beam with a wavelength having transmissibility with respect to the substrate, to the inside of the substrate, and executing irradiation with the second laser beam along the planned dividing lines from the back surface side of the substrate, and a dividing step of giving, after executing the modified layer forming step, an external force to the wafer and dividing the wafer along the planned dividing lines. An irradiation condition of the first laser beam is set to cause melting of the stacked body to occur more readily in the outer circumferential surplus region than in the device region.

Preferably, the energy density of the first laser beam with which the outer circumferential surplus region is irradiated is higher than the energy density of the first laser beam with which the device region is irradiated. Further, preferably, the peak power of the first laser beam with which the outer circumferential surplus region is irradiated is higher than the peak power of the first laser beam with which the device region is irradiated. Moreover, preferably, the overlap rate of the first laser beam with which the outer circumferential surplus region is irradiated is higher than the overlap rate of the first laser beam with which the device region is irradiated.

In accordance with a still further aspect of the present invention, there is provided a manufacturing method of chips. The manufacturing method of chips includes a preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, and a laser processed groove forming step of forming laser processed grooves along the planned dividing lines through executing irradiation with a first laser beam with a wavelength having absorbability with respect to the stacked body, along the planned dividing lines from the side of the stacked body of the wafer. The manufacturing method of chips also includes a modified layer forming step of forming, after executing the laser processed groove forming step, modified layers along the planned dividing lines through positioning the focusing position of a second laser beam with a wavelength having transmissibility with respect to the substrate, to the inside of the substrate, and executing irradiation with the second laser beam along the planned dividing lines from the back surface side of the substrate, and a dividing step of giving, after executing the modified layer forming step, an external force to the wafer and dividing the wafer along the planned dividing lines. The laser processed grooves formed in the outer circumferential surplus region are deeper than the laser processed grooves formed in the device region.

Preferably, the laser processed grooves with a depth that does not reach the substrate are formed in the device region, and the laser processed grooves with a depth that reaches the substrate are formed in the outer circumferential surplus region. Further, preferably, the manufacturing method of chips further includes a position adjustment step of observing, after executing the laser processed groove forming step but before executing the modified layer forming step, the laser processed groove formed in the outer circumferential surplus region from the back surface side of the substrate and adjusting the positional relation between the wafer and the second laser beam to cause a region that overlaps with the laser processed groove, to be irradiated with the second laser beam.

In accordance with a still further aspect of the present invention, there is provided a wafer including a substrate and a stacked body disposed on the front surface side of the substrate. The wafer has a device region and an outer circumferential surplus region. The device region has a plurality of devices disposed in a plurality of regions marked out by a plurality of planned dividing lines arranged in a lattice manner, and the outer circumferential surplus region surrounds the device region. Grooves along the planned dividing lines are formed in the stacked body, and the grooves formed in the outer circumferential surplus region are deeper than the grooves formed in the device region.

Preferably, the grooves with a depth that does not reach the substrate are formed in the device region, and the grooves with a depth that reaches the substrate are formed in the outer circumferential surplus region.

In accordance with a still further aspect of the present invention, there is provided a position adjustment method of a laser beam. The position adjustment method of a laser beam includes a grooved wafer preparation step of preparing a wafer that includes a substrate and a stacked body disposed on the front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region. Grooves along the planned dividing lines are formed in the stacked body. The position adjustment method of a laser beam also includes a position adjustment step of observing the groove formed in the outer circumferential surplus region from the back surface side of the substrate and adjusting the positional relation between the wafer and the laser beam to cause a region that overlaps with the groove, to be irradiated with the laser beam. The grooves formed in the outer circumferential surplus region are deeper than the grooves formed in the device region.

Preferably, the grooves with a depth that does not reach the substrate are formed in the device region, and the grooves with a depth that reaches the substrate are formed in the outer circumferential surplus region.

According to one aspect of the present invention, the laser processed grooves with a depth that does not reach the substrate are formed in the device region of the wafer. Consequently, the laser processed grooves that function as the origin of dividing of the stacked body can be formed while lowering of the flexural strength of the chip due to remaining of a processing mark in the substrate is avoided. Further, in the outer circumferential surplus region of the wafer, the laser processed grooves deeper than the laser processed grooves formed in the device region are formed. This facilitates observation of the laser processed grooves in the outer circumferential surplus region from the back surface side of the substrate, and position adjustment (alignment) between the wafer and the second laser beam based on the position of the laser processed groove becomes easy. As a result, it becomes possible to properly adjust the irradiation position of the second laser beam while suppressing lowering of the strength of the chip.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
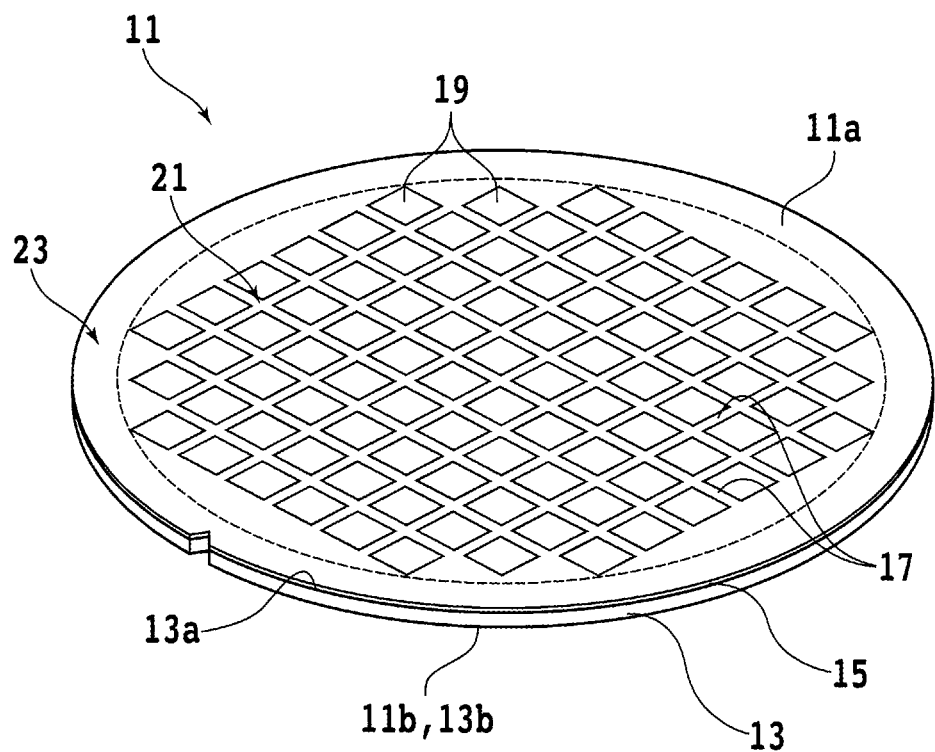
FIG. 1A is a perspective view illustrating a wafer.

An embodiment according to one aspect of the present invention will be described below with reference to the accompanying drawings. First, description will be made regarding a configuration example of a wafer that can be used for a manufacturing method of a wafer and a manufacturing method of chips according to the present embodiment. FIG. 1A is a perspective view illustrating a wafer 11.

The wafer 11 includes a substrate 13 with a circular disc shape. For example, the substrate 13 is composed of a semiconductor material such as silicon and includes a front surface (first surface) 13a and a back surface (second surface) 13b that are substantially parallel to each other. However, there is no limit on the material, shape, structure, size, and so forth of the substrate 13. For example, the substrate 13 may be a substrate composed of a semiconductor other than silicon (GaAs, SiC, InP, GaN, or the like), sapphire, glass, ceramic, resin, metal, or the like. Note that the back surface 13b of the substrate 13 is equivalent to a back surface (second surface) 11b of the wafer 11. A stacked body 15 including stacked plural thin films is disposed on the side of the front surface 13a of the substrate 13. The stacked body 15 includes various kinds of thin films such as an electrically-conductive film that functions as an electrode and an insulating film (for example, low dielectric constant insulating film (Low-k film)) that functions as an interlayer insulating film, and is formed across the whole of the side of the front surface 13a of the substrate 13. Note that a front surface (upper surface) of the stacked body 15 is equivalent to a front surface (first surface) 11a of the wafer 11. The wafer 11 is segmented into plural rectangular regions by plural planned dividing lines (streets) 17 arranged in a lattice manner to intersect each other. Further, a device 19 such as an integrated circuit (IC), large scale integration (LSI), or a micro electro mechanical systems (MEMS) device is formed in each of the plural regions marked out by the planned dividing lines 17. However, there is no limit on the kind, quantity, shape, structure, size, arrangement, and so forth of the device 19.

The wafer 11 includes a substantially circular device region 21 in which the plural devices 19 are formed and an outer circumferential surplus region 23 that surrounds the device region 21. The outer circumferential surplus region 23 is equivalent to an annular region with a predetermined width (for example, approximately 2 mm) including the outer circumferential edges of the substrate 13 and the stacked body 15. In FIG. 1A, the boundary between the device region 21 and the outer circumferential surplus region 23 is illustrated by a dashed line.

Figure 1B:
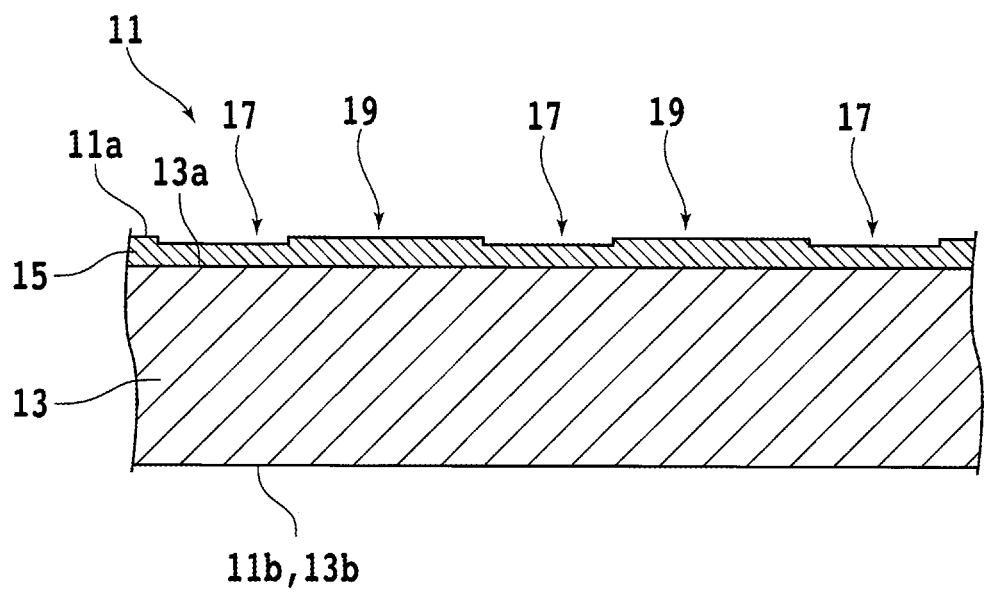
FIG. 1B is a sectional view illustrating part of the wafer.

FIG. 1B is a sectional view illustrating part of the wafer 11. The plural regions surrounded by the planned dividing lines 17 in the stacked body 15 each configure the device 19. For example, semiconductor elements are configured by the side of the front surface 13a of the substrate 13 and the thin films included in the stacked body 15. Further, part of the thin films included in the stacked body 15 is formed also on the planned dividing lines 17. The region located on the planned dividing line 17 in the stacked body 15 may configure a TEG or the like used for inspection of the devices 19, for example.

By dividing the wafer 11 along the planned dividing lines 17, plural chips (device chips) each including the device 19 are manufactured. For example, the wafer 11 is divided by laser processing with use of a laser processing apparatus. A specific example of the manufacturing method of chips in which the wafer 11 is divided to manufacture the chips will be described below.

First, the wafer 11 is prepared (preparation step). As described above, the wafer 11 includes the substrate 13 and the stacked body 15 disposed on the side of the front surface 13a of the substrate 13. Further, the wafer 11 includes the device region 21 and the outer circumferential surplus region 23 (see FIG. 1A and FIG. 1B).

Figure 2:
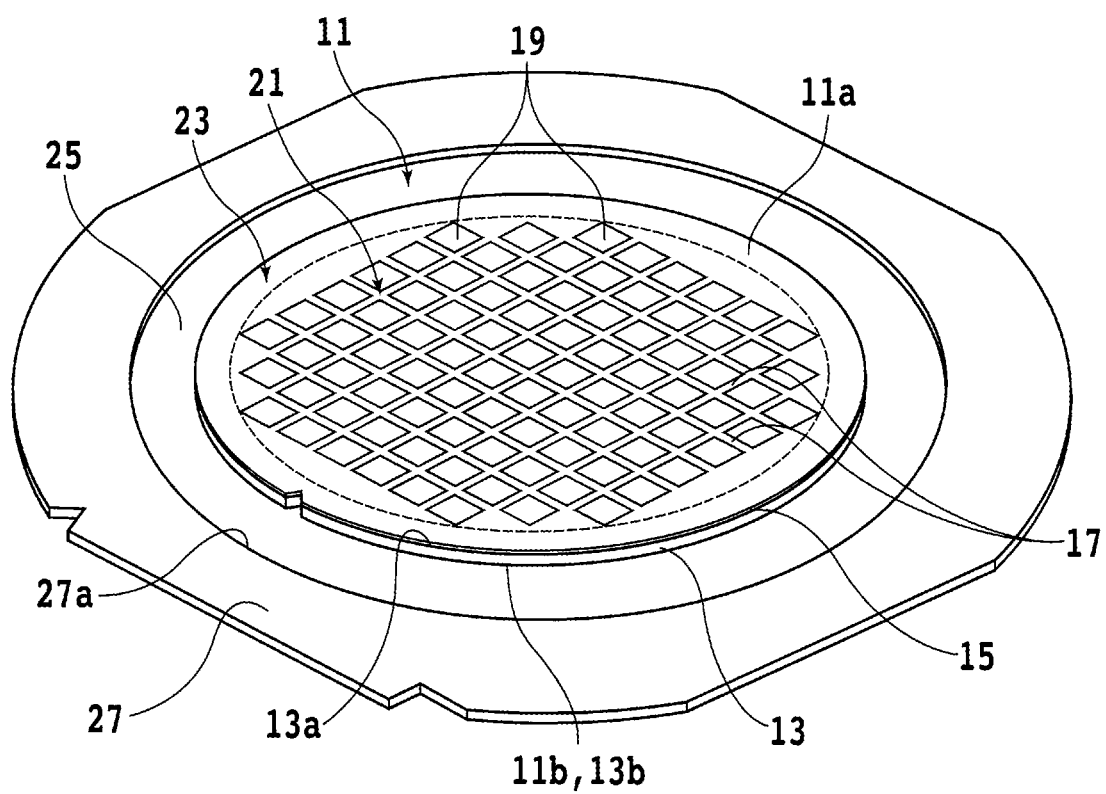
FIG. 2 is a perspective view illustrating the wafer supported by an annular frame.

The wafer 11 is supported by an annular frame. FIG. 2 is a perspective view illustrating the wafer 11 supported by an annular frame 27. A circular tape 25 with a larger diameter than that of the substrate 13 is stuck to the side of the back surface 13b of the substrate 13. For example, the tape 25 includes a film-shaped base formed into a circular shape and an adhesive layer (glue layer) disposed on the base. The base is composed of a resin such as polyolefin, polyvinyl chloride, or polyethylene terephthalate. Further, the adhesive layer is composed of an epoxy-based, acrylic-based, or rubber-based adhesive, for example. Note that the adhesive layer may be an ultraviolet-curable resin that cures through irradiation with ultraviolet. The outer circumferential part of the tape 25 is stuck to the annular frame 27 composed of a metal such as stainless steel (SUS). A circular opening 27a that penetrates the frame 27 in the thickness direction is made at the central part of the frame 27. Note that the diameter of the opening 27a is larger than that of the substrate 13. When the central part of the tape 25 is stuck to the side of the back surface 13b of the substrate 13 and the outer circumferential part of the tape 25 is stuck to the frame 27 in the state in which the substrate 13 is disposed inside the opening 27a, the wafer 11 is supported by the frame 27 through the tape 25.

Next, irradiation with a laser beam (first laser beam) with a wavelength having absorbability with respect to the stacked body 15 is executed along the planned dividing lines 17 from the side of the stacked body 15 of the wafer 11, and grooves (laser processed grooves) are formed along the planned dividing lines 17 (laser processed groove forming step). In the present embodiment, first laser processing is executed for the wafer 11 by using a laser processing apparatus, and the laser processed grooves are formed.

Figure 3:
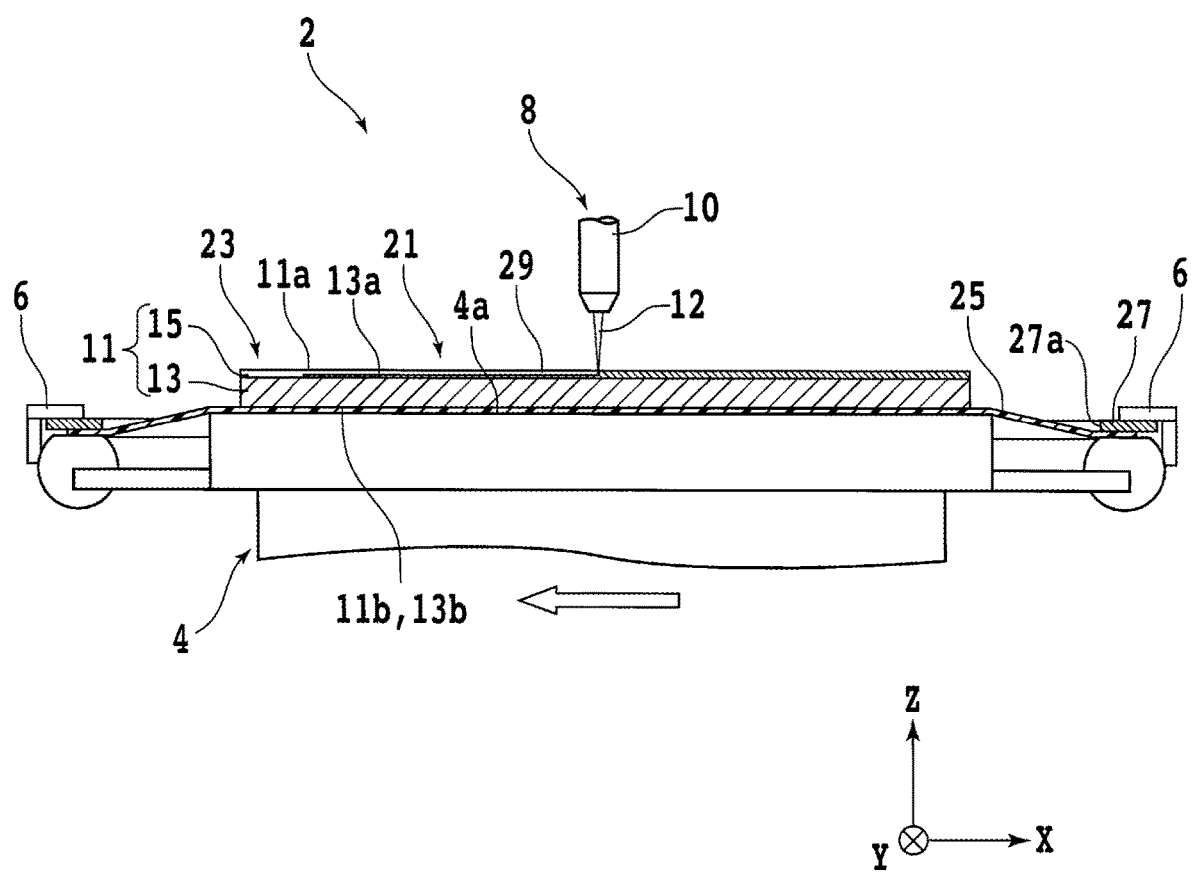
FIG. 3 is a partially sectional front view illustrating a laser processing apparatus.

FIG. 3 is a partially sectional front view illustrating a laser processing apparatus 2. Note that, in FIG. 3, an X-axis direction (processing feed direction, first horizontal direction) and a Y-axis direction (indexing feed direction, second horizontal direction) are directions perpendicular to each other. Further, a Z-axis direction (vertical direction, upward-downward direction, height direction) is the direction perpendicular to the X-axis direction and the Y-axis direction.

The laser processing apparatus 2 includes a chuck table (holding table) 4 that holds the wafer 11. The upper surface of the chuck table 4 is a circular flat surface substantially parallel to the horizontal direction (XY-plane direction) and configures a holding surface 4a that holds the wafer 11. The holding surface 4a is connected to a suction source (not illustrated) such as an ejector through a flow path (not illustrated) formed inside the chuck table 4, a valve (not illustrated), and so forth. A movement mechanism (not illustrated) of a ball screw system that moves the chuck table 4 along the X-axis direction is coupled to the chuck table 4. Further, a rotational drive source (not illustrated) such as a motor that rotates the chuck table 4 around a rotation axis substantially perpendicular to the holding surface 4a is coupled to the chuck table 4. Moreover, plural clamps 6 that grasp and fix the frame 27 are disposed around the chuck table 4.

Further, the laser processing apparatus 2 includes a laser irradiation unit 8 that executes irradiation with a laser beam. The laser irradiation unit 8 includes a laser oscillator (not illustrated) of a YAG laser, $YVO_4$ laser, YLF laser, or the like and a head 10 disposed over the chuck table 4. An optical system that guides, to the wafer 11, the laser beam of pulse oscillation emitted from the laser oscillator is incorporated in the head 10, and the optical system includes optical elements such as a collecting lens that focuses the laser beam. The wafer 11 is processed by a laser beam (first laser beam) 12 with which irradiation is executed from the laser irradiation unit 8.

In the laser processed groove forming step, first, the wafer 11 is held by the chuck table 4. Specifically, the wafer 11 is disposed over the chuck table 4 in such a manner that the side of the back surface 11b (side of the back surface 13b of the substrate 13, side of the tape 25) faces the holding surface 4a and that the side of the front surface 11a (side of the stacked body 15) is exposed upward. Further, the frame 27 is fixed by the plural clamps 6. When a suction force (negative pressure) of the suction source is made to act on the holding surface 4a in this state, the wafer 11 is held under suction by the chuck table 4 with the interposition of the tape 25.

Next, the chuck table 4 is rotated, and the length direction of the planned dividing lines 17 (see FIG. 1A and so forth) is made to match the processing feed direction (X-axis direction). Further, the position of the chuck table 4 in the indexing feed direction (Y-axis direction) is adjusted to make the positions in the Y-axis direction correspond with each other between the region to be irradiated with the laser beam 12 (irradiation-target region) and the region inside both ends of the planned dividing line 17 in the width direction (for example, center of the planned dividing line 17 in the width direction). Moreover, the position of the head 10 and disposing of the optical system are adjusted to make the focusing position of the laser beam 12 be positioned to the same height position (position in the Z-axis direction) as the front surface or inside of the stacked body 15. Then, while the laser beam 12 is output from the laser irradiation unit 8, the chuck table 4 is moved along the processing feed direction (X-axis direction). Consequently, the chuck table 4 and the laser beam 12 relatively move at a predetermined speed (processing feed rate) along the processing feed direction (X-axis direction), and irradiation with the laser beam 12 is executed along the planned dividing line 17 from the side of the front surface 11a (side of the stacked body 15) of the wafer 11.

An irradiation condition of the laser beam 12 is set to cause ablation processing to be executed for the stacked body 15. Specifically, the wavelength of the laser beam 12 is set to cause at least part of the laser beam 12 to be absorbed by the stacked body 15. That is, the laser beam 12 is a laser beam with a wavelength having absorbability with respect to the stacked body 15. Further, other irradiation conditions of the laser beam 12 are also set to cause the ablation processing to be properly executed for the stacked body 15. When the stacked body 15 is irradiated with the laser beam 12 along the planned dividing line 17, the region irradiated with the laser beam 12 in the stacked body 15 is removed by the ablation processing. As a result, a laser processed groove 29 along the planned dividing line 17 is formed in the stacked body 15.

Here, in the laser processed groove forming step, an irradiation condition of the laser beam 12 is set to cause melting of the stacked body 15 to occur more readily in the outer circumferential surplus region 23 than in the device region 21. That is, the irradiation condition (first irradiation condition) of the laser beam 12 with which the outer circumferential surplus region 23 is irradiated is different from the irradiation condition (second irradiation condition) of the laser beam 12 with which the device region 21 is irradiated. Further, the first irradiation condition is set to a condition under which melting of the stacked body 15 occurs more readily and the laser processed groove 29 is formed more readily than under the second irradiation condition.

For example, between the first irradiation condition and the second irradiation condition, the energy density or the overlap rate of the laser beam 12 is set to different values. Assuming that the average output power of the laser beam 12 is defined as P (W), that the repetition frequency of the laser beam 12 is defined as F (kHz), and that the irradiation area (area at the focusing position) of the laser beam 12 is defined as S (cm$^2$), the pulse energy E (mJ) and the energy density I (mJ/cm$^2$) of the laser beam 12 are represented by expressions (1) and (2), respectively.

[Math. 1]

$$E = \frac{P}{F} \quad (1)$$

[Math. 2]

$$I = \frac{E}{S} \quad (2)$$

Further, assuming that the processing feed rate at the time of irradiation with the laser beam 12 is defined as V (mm/s) and that the spot diameter (diameter at the focusing position) of the laser beam 12 is defined as d (mm), the overlap rate OL (%) of the laser beam 12 is represented by expression (3).

[Math. 3]

$$OL = \left(1 - \frac{V}{d \times F \times 1000}\right) \times 100 \quad (3)$$

Further, the irradiation condition (first irradiation condition) of the laser beam 12 with which the outer circumferential surplus region 23 is irradiated is set as follows, for example.
Wavelength: 355 nm
Average output power: 2 W
Repetition frequency: 200 kHz
Processing feed rate: 400 mm/s
Moreover, the irradiation condition (second irradiation condition) of the laser beam 12 with which the device region 21 is irradiated is set as follows, for example.
Wavelength: 355 nm
Average output power: 1 W
Repetition frequency: 200 kHz
Processing feed rate: 400 mm/s
When the first irradiation condition and the second irradiation condition are set as above, the average output power of the laser beam 12 with which the outer circumferential surplus region 23 is irradiated becomes higher than that of the laser beam 12 with which the device region 21 is irradiated. Consequently, the energy density of the laser beam 12 with which the outer circumferential surplus region 23 is irradiated becomes higher than that of the laser beam 12 with which the device region 21 is irradiated. As a result, melting of the stacked body 15 is caused to occur more readily in the outer circumferential surplus region 23 than in the device region 21.

Note that the setting method of the first irradiation condition and the second irradiation condition is not limited to the above. For example, only the peak power of the laser beam 12 may be made different between the first irradiation condition and the second irradiation condition. The peak power of the laser beam 12 is equivalent to a value obtained by dividing the pulse energy of the laser beam 12 by the pulse width of the laser beam 12 and affects the melting of the stacked body 15. When the peak power of the first irradiation condition is set to a value larger than the peak power of the second irradiation condition, the peak power of the laser beam 12 with which the outer circumferential surplus region 23 is irradiated becomes higher than that of the laser beam 12 with which the device region 21 is irradiated. In this case, even if the energy density of the laser beam 12 is equal between the first irradiation condition and the second irradiation condition, melting of the stacked body 15 is caused to occur more readily in the outer circumferential surplus region 23 than in the device region 21.

Further, only the processing feed rate may be made different between the first irradiation condition and the second irradiation condition. In this case, the processing feed rate of the first irradiation condition is set to a value smaller than the processing feed rate of the second irradiation condition. That is, the processing feed rate when the outer circumferential surplus region 23 is irradiated with the laser beam 12 becomes lower than that when the device region 21 is irradiated with the laser beam 12. Consequently, the overlap rate of the laser beam 12 with which the outer circumferential surplus region 23 is irradiated becomes higher than that of the laser beam 12 with which the device region 21 is irradiated. As a result, melting of the stacked body 15 is caused to occur more readily in the outer circumferential surplus region 23 than in the device region 21.

Further, melting of the stacked body 15 may be caused to occur more readily in the outer circumferential surplus region 23 than in the device region 21, by setting another parameter (spot diameter, irradiation area, repetition frequency, or the like) of the laser beam 12 to different values between the first irradiation condition and the second irradiation condition. Moreover, two or more parameters may be set to different values between the first irradiation condition and the second irradiation condition.

When processing feed of the chuck table 4 is executed, one end part of the outer circumferential surplus region 23, the device region 21, and the other end part of the outer circumferential surplus region 23 are sequentially irradiated with the laser beam 12. Further, the irradiation condition of the laser beam 12 is switched from the first irradiation condition to the second irradiation condition at the timing of the transition from the state in which the one end part of the outer circumferential surplus region 23 is irradiated with the laser beam 12 to the state in which the device region 21 is irradiated with the laser beam 12. Moreover, the irradiation condition of the laser beam 12 is switched from the second irradiation condition to the first irradiation condition at the timing of the transition from the state in which the device region 21 is irradiated with the laser beam 12 to the state in which the other end part of the outer circumferential surplus region 23 is irradiated with the laser beam 12.

Figure 4A:
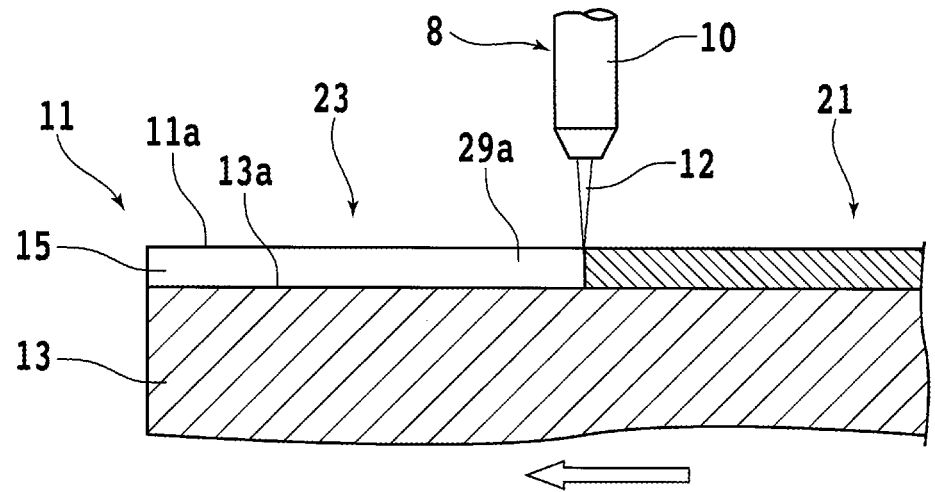
FIG. 4A is a sectional view illustrating part of the wafer when one end part of an outer circumferential surplus region is irradiated with a laser beam.

FIG. 4A is a sectional view illustrating part of the wafer 11 when the one end part of the outer circumferential surplus region 23 is irradiated with the laser beam 12. First, the one end part of the outer circumferential surplus region 23 is irradiated with the laser beam 12 in the state in which the irradiation condition of the laser beam 12 is set to the first irradiation condition. Thus, in the stacked body 15, the laser processed groove 29 (laser processed groove 29a) with a depth that reaches the front surface 13a of the substrate 13 is formed along the planned dividing line 17. Then, when the region irradiated with the laser beam 12 reaches the boundary between the outer circumferential surplus region 23 and the device region 21, the irradiation condition of the laser beam 12 is switched from the first irradiation condition to the second irradiation condition. Thereafter, the device region 21 is irradiated with the laser beam 12 in the state in which the irradiation condition of the laser beam 12 is set to the second irradiation condition.

Figure 4B:
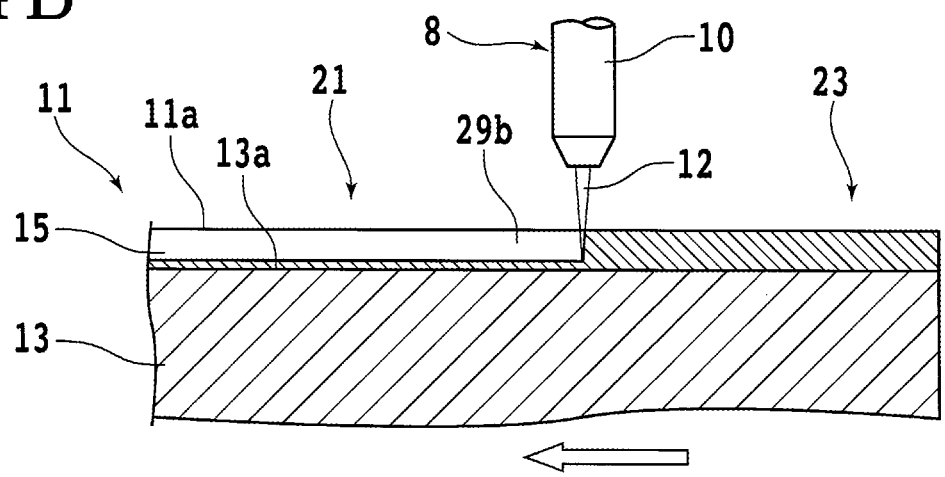
FIG. 4B is a sectional view illustrating part of the wafer when a device region is irradiated with the laser beam.

FIG. 4B is a sectional view illustrating part of the wafer 11 when the device region 21 is irradiated with the laser beam 12. As described above, the second irradiation condition is the irradiation condition of the laser beam 12 under which melting of the stacked body 15 occurs less readily than under the first irradiation condition. Thus, when the device region 21 is irradiated with the laser beam 12 under the second irradiation condition, in the stacked body 15, the laser processed groove 29 (laser processed groove 29b) with a depth that does not reach the front surface 13a of the substrate 13 is formed along the planned dividing line 17. Then, when the region irradiated with the laser beam 12 reaches the boundary between the device region 21 and the outer circumferential surplus region 23, the irradiation condition of the laser beam 12 is switched from the second irradiation condition to the first irradiation condition. Thereafter, the other end part of the outer circumferential surplus region 23 is irradiated with the laser beam 12 in the state in which the irradiation condition of the laser beam 12 is set to the first irradiation condition.

Figure 4C:
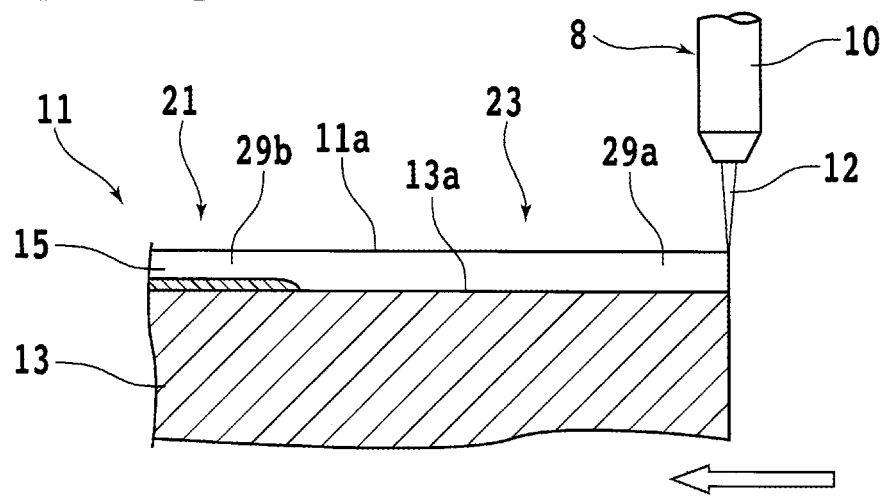
FIG. 4C is a sectional view illustrating part of the wafer when the other end part of the outer circumferential surplus region is irradiated with the laser beam.

FIG. 4C is a sectional view illustrating part of the wafer 11 when the other end part of the outer circumferential surplus region 23 is irradiated with the laser beam 12. When the other end part of the outer circumferential surplus region 23 is irradiated with the laser beam 12 under the first irradiation condition, in the stacked body 15, the laser processed groove 29 (laser processed groove 29a) with a depth that reaches the front surface 13a of the substrate 13 is formed along the planned dividing line 17.

Thereafter, a similar procedure is repeated, and irradiation with the laser beam 12 is executed along the other planned dividing lines 17. As a result, in the outer circumferential surplus region 23 of the wafer 11, the laser processed grooves 29a that split the stacked body 15 are formed along the planned dividing lines 17. On the other hand, in the device region 21 of the wafer 11, the laser processed grooves 29b that do not split the stacked body 15 are formed in a lattice manner along the planned dividing lines 17. Note that it is also possible to execute irradiation with the laser beam 12 plural times along each planned dividing line 17. For example, irradiation with the laser beam 12 may be executed in such a manner that the irradiation position moves back and forth along each planned dividing line 17. In this case, the outer circumferential surplus region 23 is irradiated with the laser beam 12 under the first irradiation condition in the forward path (or backward path), and the device region 21 is irradiated with the laser beam 12 under the second irradiation condition in the backward path (or forward path).

Figure 5A:
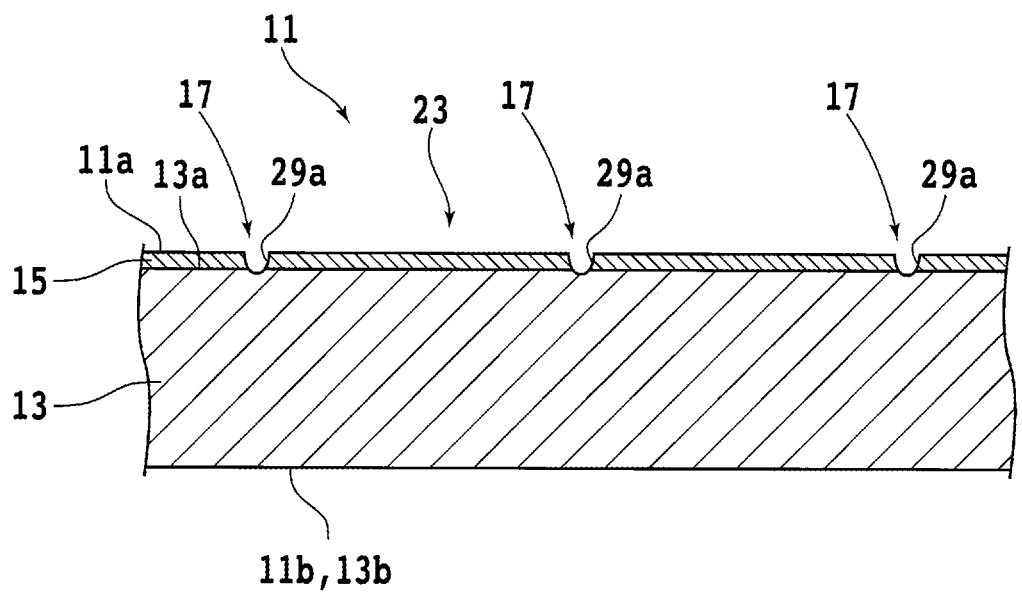
FIG. 5A is a sectional view illustrating part of the outer circumferential surplus region of the wafer.
Figure 5B:
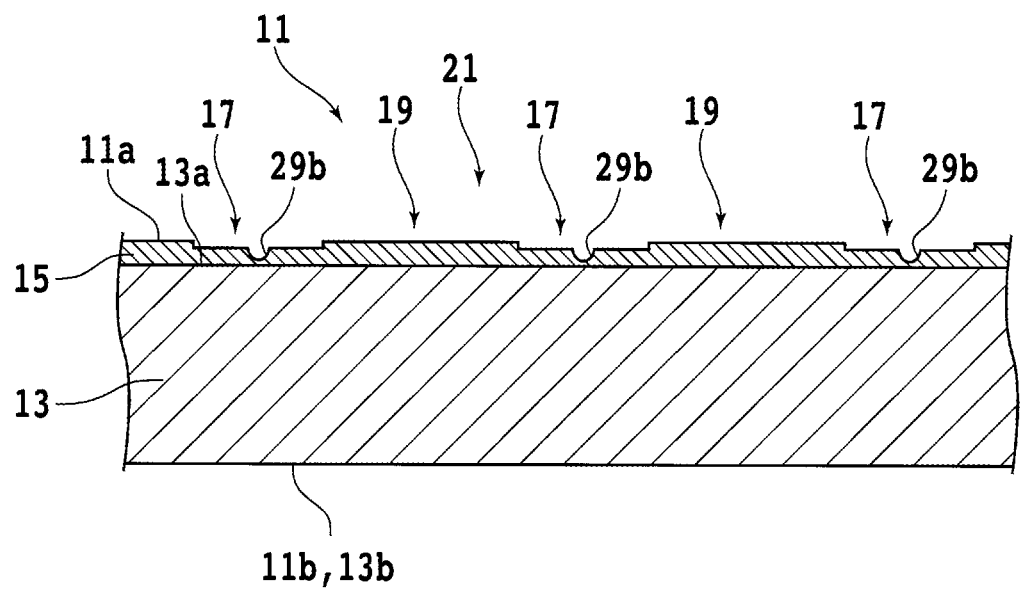
FIG. 5B is a sectional view illustrating part of the device region of the wafer.

FIG. 5A is a sectional view illustrating part of the outer circumferential surplus region 23 of the wafer 11. FIG. 5B is a sectional view illustrating part of the device region 21 of the wafer 11. When the wafer 11 is irradiated with the laser beam 12 under the above-described condition, the laser processed grooves 29a formed in the outer circumferential surplus region 23 become deeper than the laser processed grooves 29b formed in the device region 21. Further, on the planned dividing lines 17 in the outer circumferential surplus region 23, the stacked body 15 is removed, and the side of the front surface 13a of the substrate 13 is exposed. On the other hand, on the planned dividing lines 17 in the device region 21, part of the stacked body 15 remains between the substrate 13 and the laser processed grooves 29a, and the side of the front surface 13a of the substrate 13 is not exposed.

Note that the laser processed grooves 29a are not necessarily formed more deeply than the laser processed grooves 29b (to reach the substrate 13) in the whole of the outer circumferential surplus region 23. That is, it suffices that at least part of the laser processed grooves 29a is formed more deeply than the laser processed grooves 29b (to reach the substrate 13). On the other hand, it is preferable for the laser processed grooves 29b to be formed in such a manner as not to reach the substrate 13 in the whole of the device region 21.

For example, the irradiation condition of the laser beam 12 may be switched from the first irradiation condition to the second irradiation condition before the region irradiated with the laser beam 12 reaches the boundary between the one end part of the outer circumferential surplus region 23 and the device region 21. Further, the irradiation condition of the laser beam 12 may be switched from the second irradiation condition to the first irradiation condition after the region irradiated with the laser beam 12 has reached the boundary between the device region 21 and the other end part of the outer circumferential surplus region 23. In this case, part of the laser processed groove 29a is formed to a depth equivalent to that of the laser processed groove 29b. Moreover, the laser processed groove 29a formed in the outer circumferential surplus region 23 may be formed only in partial regions on the planned dividing line 17. For example, in the outer circumferential surplus region 23, the laser processed groove 29a in a manner of plural dots may be formed along the planned dividing line 17. In this case, regions in which the laser processed groove 29a is present and regions in which the laser processed groove 29a is not present are alternately arranged along the planned dividing line 17. Further, the laser processed grooves 29a formed in the outer circumferential surplus region 23 are not necessarily formed along all planned dividing lines 17. For example, one laser processed groove 29a may be formed every predetermined number of (two or more) planned dividing lines 17.

Moreover, an annular cutting blade may be made to cut into the outer circumferential surplus region 23 instead of irradiating the outer circumferential surplus region 23 with the laser beam 12. In this case, cut grooves are formed instead of the laser processed grooves 29a. Then, the cut grooves formed in the outer circumferential surplus region 23 and the laser processed grooves 29b formed in the device region 21 are coupled. Note that the regions in which the cut grooves are formed and the depth, shape, number, and so forth of the cut grooves can be set similarly to the laser processed grooves 29a. In addition, the formation of the cut grooves may be executed at either a timing before formation of the laser processed grooves 29b or a timing after the formation thereof.

By executing the above-described preparation step and laser processed groove forming step, the wafer 11 (grooved wafer) in which the grooves (laser processed grooves 29) along the planned dividing lines 17 are made in the stacked body 15 is obtained (grooved wafer preparation step). That is, the grooved wafer preparation step is equivalent to the manufacturing method of the grooved wafer.

Next, second laser processing is executed for the substrate 13. For example, by irradiating the substrate 13 with a laser beam 16 (see FIG. 7), modified layers 35 (see FIG. 7) that function as the origin of dividing (trigger for dividing) are formed inside the substrate 13. Note that, although the case in which the laser processing apparatus 2 is used for the processing of the substrate 13 will be described below, another laser processing apparatus may be used for the laser processing of the substrate 13.

Figure 6A:
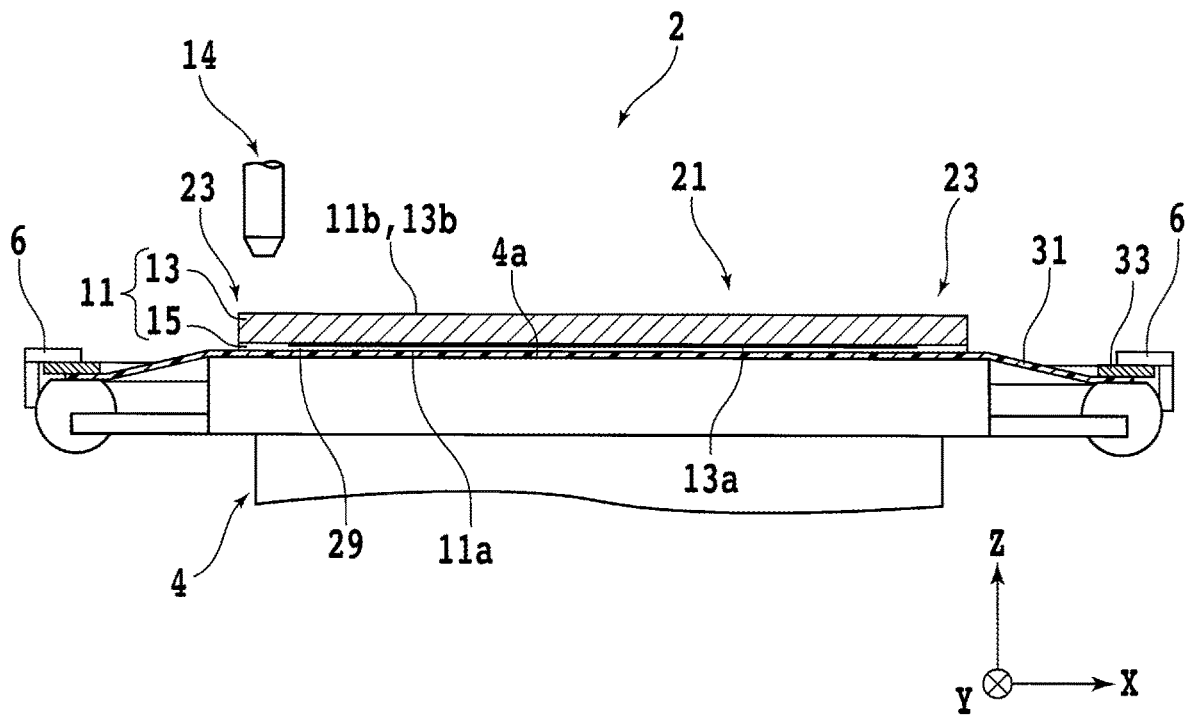
FIG. 6A is a partially sectional front view illustrating the laser processing apparatus in a position adjustment step.

When the laser processing is executed for the substrate 13, first, the positional relation between the wafer 11 and the laser beam 16 is adjusted (position adjustment step). FIG. 6A is a partially sectional front view illustrating the laser processing apparatus 2 in the position adjustment step. A specific example of the position adjustment method of the laser beam 16 will be described below.

The laser processing apparatus 2 includes an imaging unit 14 disposed over the chuck table 4 and executes position adjustment between the wafer 11 and the laser beam 16 by using the imaging unit 14. For example, the imaging unit 14 is an infrared camera including an imaging element that receives infrared and that converts it to an electrical signal.

In the position adjustment step, first, the tape 25 (see FIG. 2) is separated from the wafer 11 (grooved wafer) in which the laser processed grooves 29 are made in the stacked body 15, and thereafter, the wafer 11 is supported by an annular frame 33 through a tape 31. Note that the structures and the materials of the tape 31 and the frame 33 are similar to those of the tape 25 and the frame 27 (see FIG. 2 and so forth), respectively. Further, the central part of the tape 31 is stuck to the side of the front surface 11a (side of the stacked body 15) of the wafer 11, and the outer circumferential part of the tape 31 is stuck to the frame 33. However, it is also possible to omit the support of the wafer 11 by the frame 33. In this case, the tape 31 does not need to be stuck to the frame 33.

Next, the wafer 11 is held by the chuck table 4. Specifically, the wafer 11 is disposed over the chuck table 4 in such a manner that the side of the front surface 11a (side of the stacked body 15, side of the tape 31) faces the holding surface 4a and that the side of the back surface 11b (side of the back surface 13b of the substrate 13) is exposed upward. Further, the frame 33 is fixed by the plural clamps 6. When a suction force (negative pressure) of the suction source is made to act on the holding surface 4a in this state, the wafer 11 is held under suction by the chuck table 4 with the interposition of the tape 31.

Next, the laser processed groove 29 formed in the outer circumferential surplus region 23 is observed from the side of the back surface 13b of the substrate 13. Specifically, first, the positional relation between the chuck table 4 and the imaging unit 14 is adjusted to make the imaging unit 14 be positioned directly above the outer circumferential surplus region 23 of the wafer 11. Then, the outer circumferential surplus region 23 of the wafer 11 is imaged by the imaging unit 14.

Figure 6B:
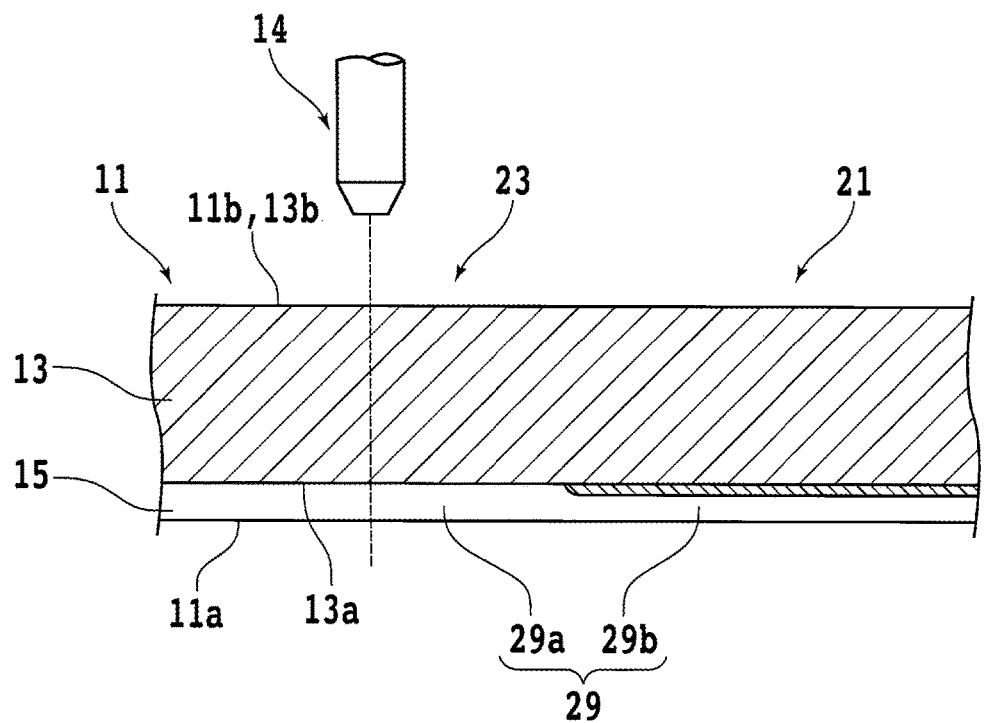
FIG. 6B is a sectional view illustrating the wafer imaged by an imaging unit.

FIG. 6B is a sectional view illustrating the wafer 11 imaged by the imaging unit 14. In the outer circumferential surplus region 23, the laser processed grooves 29a that reach the substrate 13 are formed in the stacked body 15, and the substrate 13 is partly exposed inside the laser processed grooves 29a. Thus, the transmittance of the light (infrared) differs between the region in which the laser processed groove 29a is present and the region in which the laser processed groove 29a is not present in the outer circumferential surplus region 23. As a result, images corresponding to the contours of the laser processed grooves 29a are represented in an image acquired by the imaging unit 14. As above, when the laser processed grooves 29a are formed to reach the substrate 13, the laser processed grooves 29a can be clearly observed from the side of the back surface 13b of the substrate 13. Consequently, the position of the laser processed groove 29a can be accurately grasped even in the state in which the side of the front surface 11a (side of the stacked body 15) of the wafer 11 is covered by the holding surface 4a of the chuck table 4.

Note that, although the state in which the laser processed groove 29a is formed to reach the substrate 13 is illustrated in FIG. 6B, the depth of the laser processed grooves 29a may be smaller than the thickness of the stacked body 15. That is, part of the stacked body 15 (remaining part) may slightly remain between the front surface 13a of the substrate 13 and the laser processed grooves 29a. When the remaining part is sufficiently thin, the light (infrared) is transmitted through the remaining part, and the contours of the laser processed grooves 29a are slightly represented in an image acquired by the imaging unit 14. In this case, the position of the laser processed groove 29a can be checked although the laser processed grooves 29a do not reach the substrate 13. For clear display of the contours of the laser processed grooves 29a in the image acquired by the imaging unit 14, it is preferable that the thickness of the remaining part is equal to or smaller than $1/5$ of the thickness of the stacked body 15, and it is more preferable that it is equal to or smaller than $1/10$. More specifically, it is preferable that the thickness of the remaining part is equal to or smaller than 2 μm, and it is more preferable that it is equal to or smaller than 1 μm.

Next, the positional relation between the wafer 11 and the laser beam 16 (see FIG. 7) is adjusted. Note that the laser beam 16 is a laser beam with which the wafer 11 is irradiated in a modified layer forming step to be described later. Specifically, first, the position of the laser processed groove 29a is identified based on an image acquired by the imaging unit 14. Then, the positional relation between the wafer 11 and the laser beam 16 is adjusted to cause a region overlapping with the laser processed groove 29 to be irradiated with the laser beam 16 in the modified layer forming step to be described later. More specifically, the angle of the chuck table 4 is adjusted based on the image acquired by the imaging unit 14, and the length direction of the laser processed groove 29 is made to match the processing feed direction (X-axis direction). Further, the position of the chuck table 4 in the indexing feed direction (Y-axis direction) is adjusted to make the positions in the Y-axis direction correspond with each other between the region to be irradiated with the laser beam 16 (irradiation-target region) and the region inside both ends of the laser processed groove 29a in the width direction (for example, center of the laser processed groove 29 in the width direction).

Figure 7:
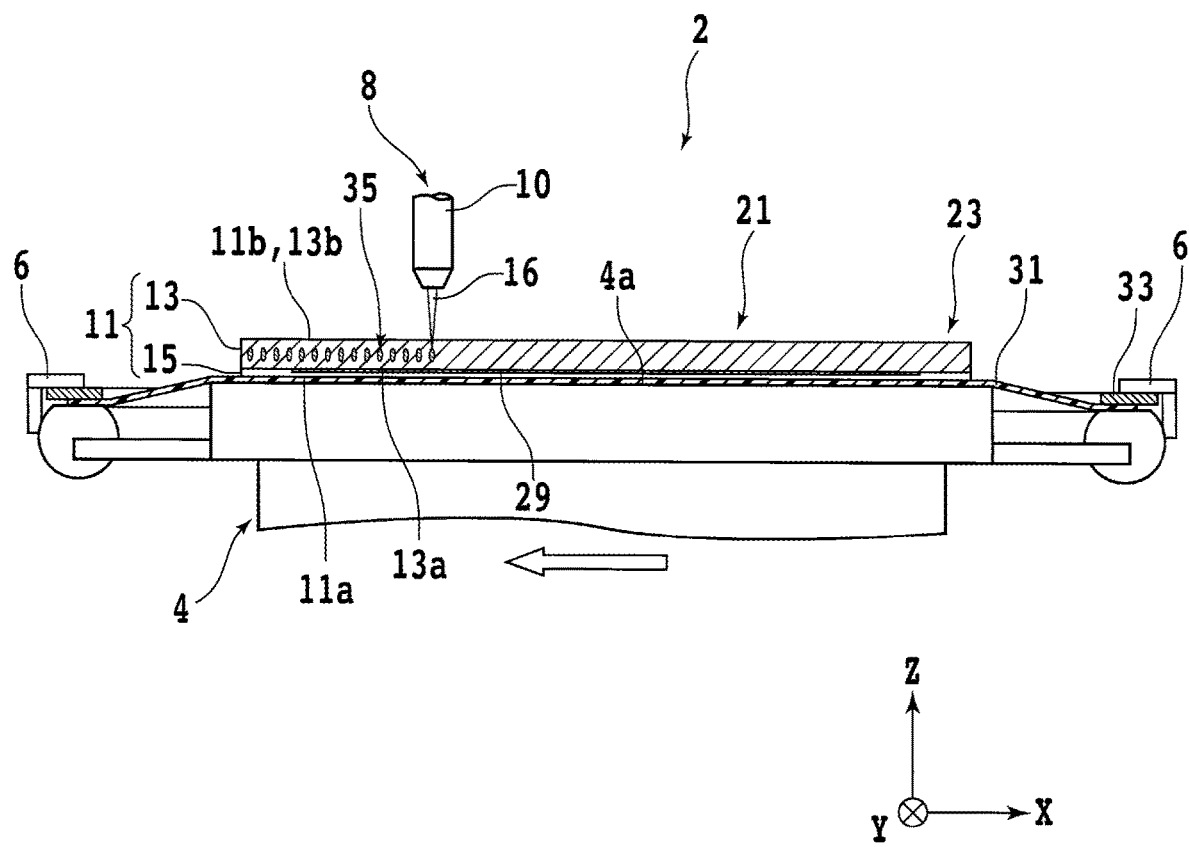
FIG. 7 is a partially sectional front view illustrating the laser processing apparatus in a modified layer forming step.

Next, irradiation with the laser beam (second laser beam) 16 with a wavelength having transmissibility with respect to the substrate 13 is executed along the planned dividing line 17 from the side of the back surface 13b of the substrate 13, and a modified layer along the planned dividing line 17 is formed (modified layer forming step). FIG. 7 is a partially sectional front view illustrating the laser processing apparatus 2 in the modified layer forming step.

In the modified layer forming step, the position of the head 10 and disposing of the optical system are adjusted to make the focusing position of the laser beam 16 be positioned to the same height position as the inside of the substrate 13 (between the front surface 13a and the back surface 13b). Then, while the laser beam 16 is output from the laser irradiation unit 8 toward the wafer 11, the chuck table 4 whose position has been adjusted in the position adjustment step is moved along the processing feed direction (X-axis direction). Consequently, the chuck table 4 and the laser beam 16 relatively move at a predetermined speed (processing feed rate) along the processing feed direction (X-axis direction), and irradiation with the laser beam 16 is executed along the planned dividing line 17 from the side of the back surface 13b of the substrate 13.

An irradiation condition of the laser beam 16 is set to cause the region irradiated with the laser beam 16 in the substrate 13 to be modified to metamorphose due to multi-photon absorption. Specifically, the wavelength of the laser beam 16 is set to cause at least part of the laser beam 16 to be transmitted through the substrate 13. That is, the laser beam 16 is a laser beam with a wavelength having transmissibility with respect to the substrate 13. Further, other irradiation conditions of the laser beam 16 are also set to cause the substrate 13 to be properly modified. An example of irradiation conditions of the laser beam 16 that allow the substrate 13 to be modified is as follows.

Wavelength: 1064 nm
  Average output power: 1 W
  Repetition frequency: 100 kHz
  Processing feed rate: 800 mm/s When the substrate 13 is irradiated with the laser beam 16, the inside of the substrate 13 is modified to metamorphose due to multi-photon absorption, and the modified layer (metamorphosed layer) 35 is formed along the planned dividing line 17 and the laser processed groove 29. Note that, because the irradiation with the laser beam 16 is executed from the side of the back surface 13b of the substrate 13, the irradiation of the inside of the substrate 13 with the laser beam 16 is not inhibited by the stacked body 15. Thereafter, irradiation with the laser beam 16 is executed along the other planned dividing lines 17 and laser processed grooves 29 with a similar procedure, and the modified layers 35 in a lattice manner are formed inside the substrate 13.

Figure 8A:
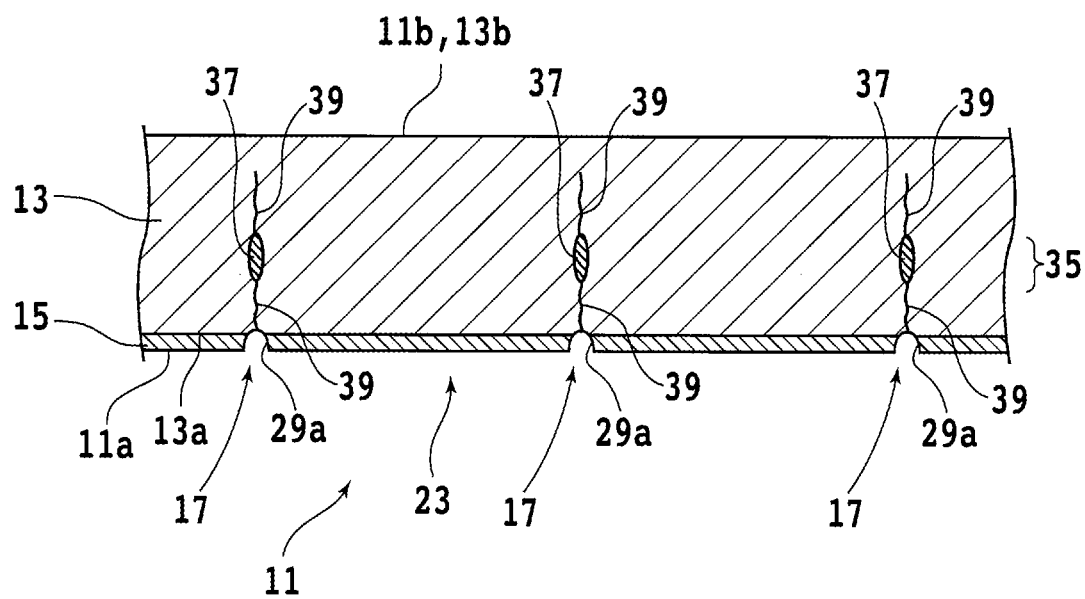
FIG. 8A is a sectional view illustrating part of the outer circumferential surplus region of the wafer in which a modified layer is formed.
Figure 8B:
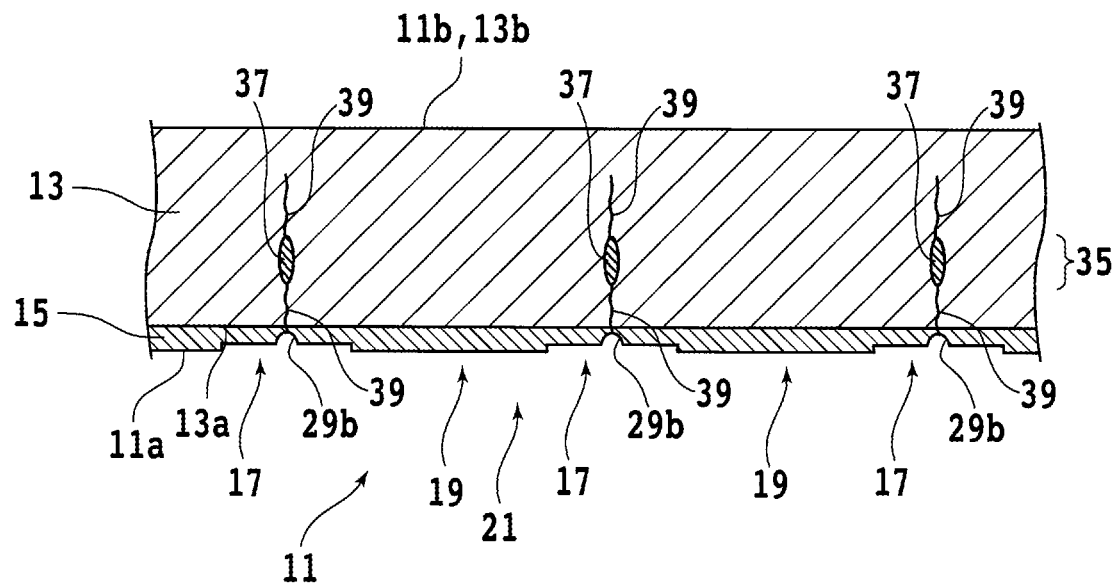
FIG. 8B is a sectional view illustrating part of the device region of the wafer in which the modified layer is formed.

FIG. 8A is a sectional view illustrating part of the outer circumferential surplus region 23 of the wafer 11 in which the modified layer 35 is formed. FIG. 8B is a sectional view illustrating part of the device region 21 of the wafer 11 in which the modified layer 35 is formed. The modified layer 35 includes plural modified regions (metamorphosed regions) 37 arising from modification and metamorphosis due to multi-photon absorption. The modified regions 37 are formed at the focusing position of the laser beam 16 (see FIG. 7) and are arranged along the planned dividing line 17 and the laser processed groove 29. Further, when the modified region 37 is formed, cracks (cleavages) 39 are generated at the modified region 37 and develop from the modified region 37 toward the front surface 13a and the back surface 13b of the substrate 13.

The regions in which the modified layers 35 and the cracks 39 are formed in the substrate 13 become more fragile than the other regions in the substrate 13. Thus, when an external force is given to the wafer 11, the substrate 13 is divided along the planned dividing lines 17 and the laser processed grooves 29 with the modified layers 35 and the cracks 39 being the origin. That is, the modified layers 35 and the cracks 39 function as the origin of dividing (trigger for dividing). Note that, depending on an irradiation condition of the laser beam 16 (see FIG. 7) and the positions of the modified regions 37, the cracks 39 reach the front surface 13a of the substrate 13. In this case, in the outer circumferential surplus region 23 (see FIG. 8A), the cracks 39 are connected to the laser processed grooves 29a. Further, in the device region 21 (see FIG. 8B), the cracks 39 develop also to the inside of the stacked body 15 and reach the laser processed grooves 29b in some cases.

Further, inside the substrate 13, plural layers of the modified layer 35 may be formed in the thickness direction of the substrate 13. For example, when the substrate 13 is a silicon wafer or the like with a thickness of 200 μm or larger, proper dividing of the substrate 13 is facilitated by forming two or more layers of the modified layer 35. In the case of forming the plural modified layers 35, irradiation with the laser beam 16 is executed plural times along each planned dividing line 17 while the focusing position of the laser beam 16 in the thickness direction of the substrate 13 is changed.

Next, an external force is given to the wafer 11, and the wafer 11 is divided along the planned dividing lines 17 (dividing step). In the dividing step, first, the wafer 11 is thinned by being ground. A grinding apparatus is used for the grinding of the wafer 11.

Figure 9:
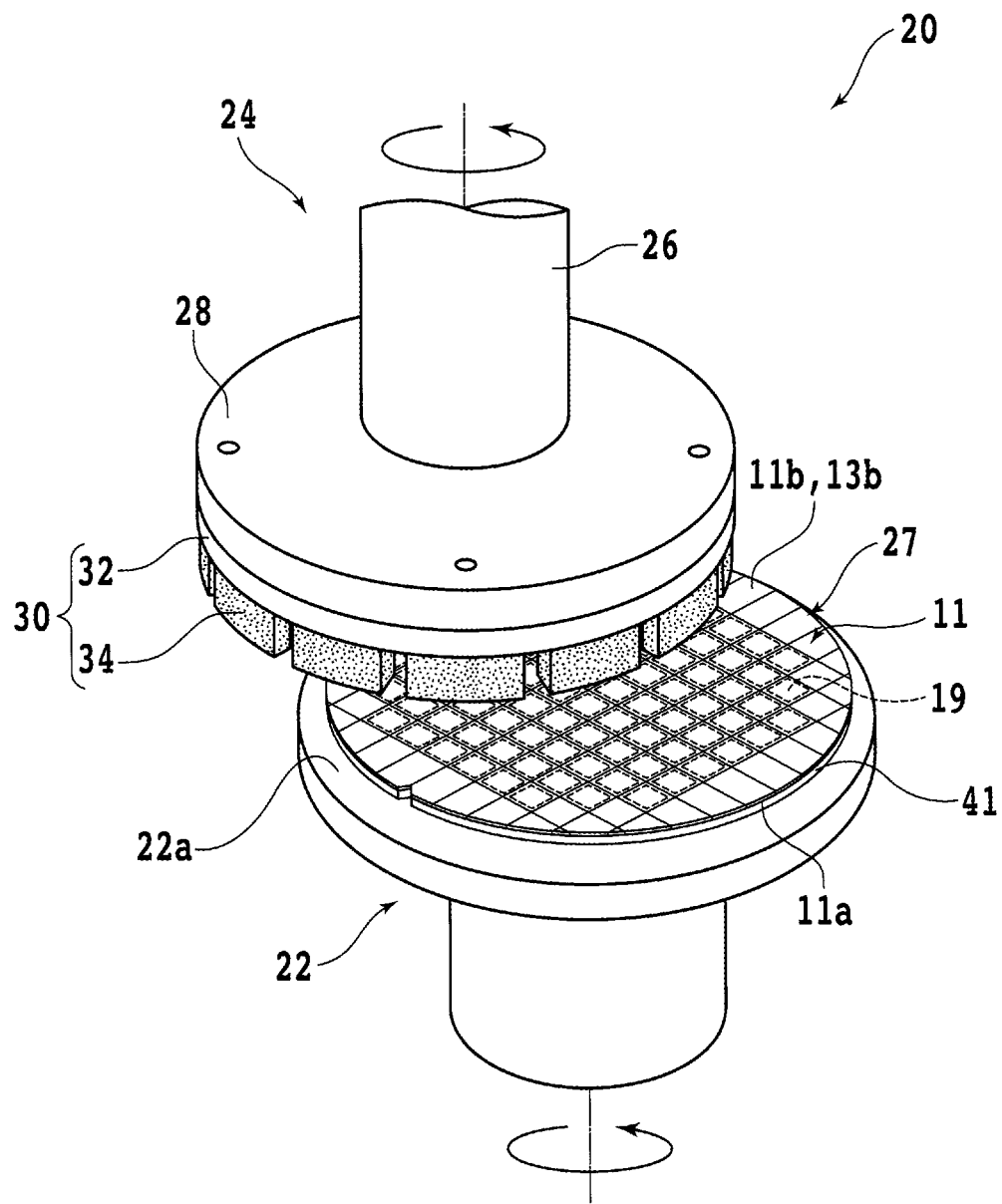
FIG. 9 is a perspective view illustrating a grinding apparatus.

FIG. 9 is a perspective view illustrating a grinding apparatus 20. The grinding apparatus 20 includes a chuck table (holding table) 22 that holds the wafer 11 and a grinding unit 24 that grinds the wafer 11.

The upper surface of the chuck table 22 is a flat surface formed along the horizontal direction and configures a holding surface 22a that holds the wafer 11. The holding surface 22a is connected to a suction source (not illustrated) such as an ejector through a flow path (not illustrated) formed inside the chuck table 22, a valve (not illustrated), and so forth. A movement mechanism (not illustrated) of a ball screw system that moves the chuck table 22 along the horizontal direction is coupled to the chuck table 22. Further, a rotational drive source (not illustrated) such as a motor that rotates the chuck table 22 around a rotation axis substantially perpendicular to the holding surface 22a is coupled to the chuck table 22.

The grinding unit 24 is disposed over the chuck table 22. The grinding unit 24 includes a circular cylindrical spindle 26 disposed along the vertical direction. A mount 28 that is composed of a metal or the like and has a circular disc shape is fixed to the tip part (lower end part) of the spindle 26. Further, a rotational drive source (not illustrated) such as a motor that rotates the spindle 26 is coupled to the base end part (upper end part) of the spindle 26.

A grinding wheel 30 that grinds the wafer 11 is mounted on the lower surface side of the mount 28. The grinding wheel 30 includes an annular base 32 that is composed of a metal such as stainless steel or aluminum and that is formed into substantially the same diameter as the mount 28. Plural grinding abrasive stones 34 are fixed to the lower surface side of the base 32. For example, the plural grinding abrasive stones 34 are formed into a rectangular parallelepiped shape and are arranged at substantially equal intervals along the outer circumference of the base 32. The grinding abrasive stones 34 are formed by fixing abrasive grains composed of diamond, cubic boron nitride (cBN), or the like by a binder such as a metal bond, a resin bond, or a vitrified bond. However, the material, shape, structure, size, and so forth of the grinding abrasive stones 34 are not limited to those described above and are selected as appropriate according to the material and so forth of the substrate 13. Further, the number of grinding abrasive stones 34 can also be set as desired.

The grinding wheel 30 rotates around a rotation axis substantially perpendicular to the holding surface 22a by power transmitted from the rotational drive source through the spindle 26 and the mount 28. Further, a movement mechanism (not illustrated) of a ball screw system that raises and lowers the grinding unit 24 along a direction substantially perpendicular to the holding surface 22a is coupled to the grinding unit 24. Moreover, a grinding liquid supply path (not illustrated) that supplies a liquid (grinding liquid) such as purified water to the wafer 11 and the grinding abrasive stones 34 is made inside or near the grinding unit 24.

The side of the back surface 11b (side of the back surface 13b of the substrate 13) of the wafer 11 is ground by the grinding apparatus 20. Specifically, first, a protective sheet 41 composed of a resin or the like is stuck to the side of the front surface 11a (side of the stacked body 15) of the wafer 11. Thus, the stacked body 15 is covered and protected by the protective sheet 41. Then, the wafer 11 is held by the chuck table 22. The wafer 11 is disposed over the chuck table 22 in such a manner that the side of the front surface 11a (side of the protective sheet 41) faces the holding surface 22a and that the side of the back surface 11b (side of the back surface 13b of the substrate 13) is exposed upward. When a negative pressure of the suction source is made to act on the holding surface 22a in this state, the wafer 11 is held under suction by the chuck table 22 with the interposition of the protective sheet 41.

Thereafter, the chuck table 22 is disposed below the grinding unit 24. Then, the grinding wheel 30 is lowered toward the chuck table 22 while the chuck table 22 and the grinding wheel 30 are each rotated in a predetermined direction at a predetermined rotation speed. The lowering speed of the grinding wheel 30 at this time is adjusted to cause the grinding abrasive stones 34 to be pressed against the wafer 11 with a proper force. When the grinding abrasive stones 34 are brought into contact with the side of the back surface 13b of the substrate 13, the side of the back surface 13b of the substrate 13 is ground, and the substrate 13 is thinned. Then, when the cracks 39 (see FIG. 8A and FIG. 8B) that develop from the modified layers 35 are exposed on the side of the back surface 13b of the substrate 13, the wafer 11 is divided along the planned dividing lines 17.

Note that, at the stage where the modified layers 35 are formed in the wafer 11, the cracks 39 do not reach the front surface 13a of the substrate 13 in some cases. In this case, due to the pressing of the grinding abrasive stones 34 against the wafer 11, an external force is given to the wafer 11, and the cracks 39 develop toward the front surface 13a of the substrate 13. As a result, the cracks 39 reach the laser processed grooves 29a and 29b, and the wafer 11 is divided.

It is preferable that the grinding of the wafer 11 is continued until the modified layers 35 formed inside the substrate 13 are removed. This can avoid remaining of the modified layer 35 in the wafer 11 after the grinding and prevent lowering of the flexural strength of chips obtained through the dividing of the wafer 11.

As described above, the wafer 11 can be divided into thinned plural chips by grinding the wafer 11 and giving an external force to the wafer 11. However, even when the grinding abrasive stones 34 are pressed against the wafer 11 in the grinding processing, a sufficient external force is not given to the wafer 11, and the dividing of the wafer 11 becomes insufficient in some cases. In this case, it is preferable to further give an external force to the wafer 11 after the grinding.

Figure 10A:
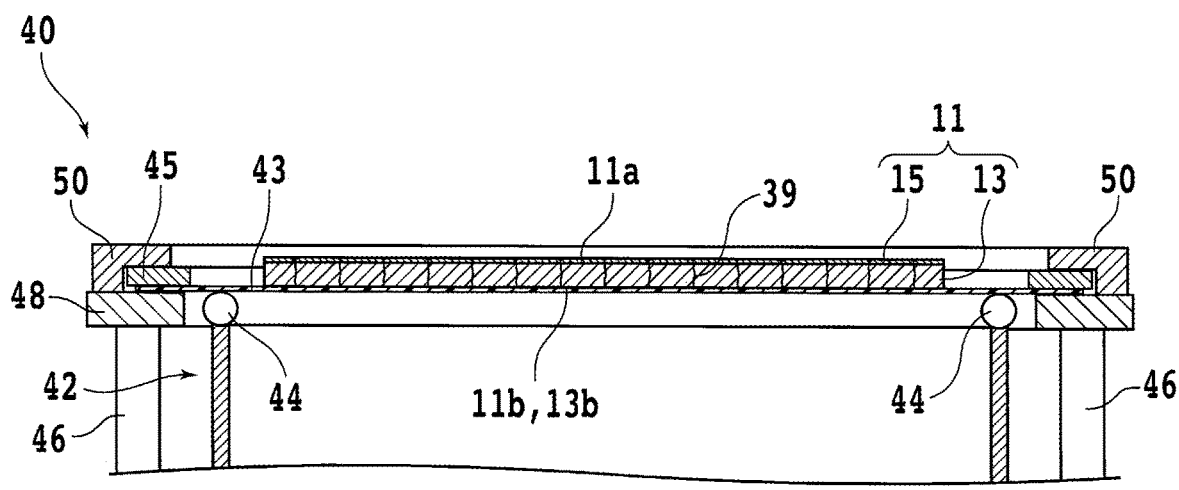
FIG. 10A is a partially sectional front view illustrating an expanding apparatus.

For example, after the protective sheet 41 is separated from the wafer 11, the wafer 11 is supported by an annular frame 45 (see FIG. 10A) through a tape 43 (see FIG. 10A). The structures and the materials of the tape 43 and the frame 45 are similar to those of the tape 25 and the frame 27 (see FIG. 2 and so forth), respectively. Then, the central part of the tape 43 is stuck to the side of the back surface 11b (side of the back surface 13b of the substrate 13) of the wafer 11, and the outer circumferential part of the tape 43 is stuck to the frame 45.

Note that the tape 43 is an expanding tape that can be expanded through giving of an external force. Further, an external force is given to the wafer 11 when the tape 43 stuck to the wafer 11 is expanded by being pulled toward the outside in the radial direction. As a result, the wafer 11 is split along the planned dividing lines 17 and is divided into plural chips. The expansion of the tape 43 may manually be executed by an operator or may be executed by a dedicated expanding apparatus. FIG. 10A is a partially sectional front view illustrating an expanding apparatus 40.

The expanding apparatus 40 has a circular cylindrical drum 42. At the upper end part of the drum 42, plural rollers 44 are disposed along the circumferential direction of the drum 42. Further, plural support components 46 are disposed outside the drum 42. An air cylinder (not illustrated) that moves (raises and lowers) the support components 46 along the vertical direction is coupled to each of the lower end parts of the support components 46. An annular table 48 is fixed to the upper end parts of the plural support components 46. A circular opening that penetrates the table 48 in the thickness direction is made at the central part of the table 48. Note that the diameter of the opening of the table 48 is larger than that of the drum 42, and the upper end part of the drum 42 can be inserted into the opening of the table 48. In addition, plural clamps 50 that grasp and fix the frame 45 supporting the wafer 11 are disposed at the outer circumferential part of the table 48.

When the wafer 11 is divided, first, the support components 46 are moved by the air cylinder (not illustrated), and the upper ends of the rollers 44 and the upper surface of the table 48 are disposed at substantially the same height position. Then, the frame 45 is disposed over the table 48, and the frame 45 is fixed by the plural clamps 50. At this time, the wafer 11 is disposed to overlap with a region inside the drum 42. Next, the support components 46 are lowered by the air cylinder (not illustrated) to pull down the table 48. Thus, the tape 43 is pulled toward the outside in the radial direction in the state of being supported by the rollers 44. As a result, the tape 43 is radially expanded.

Figure 10B:
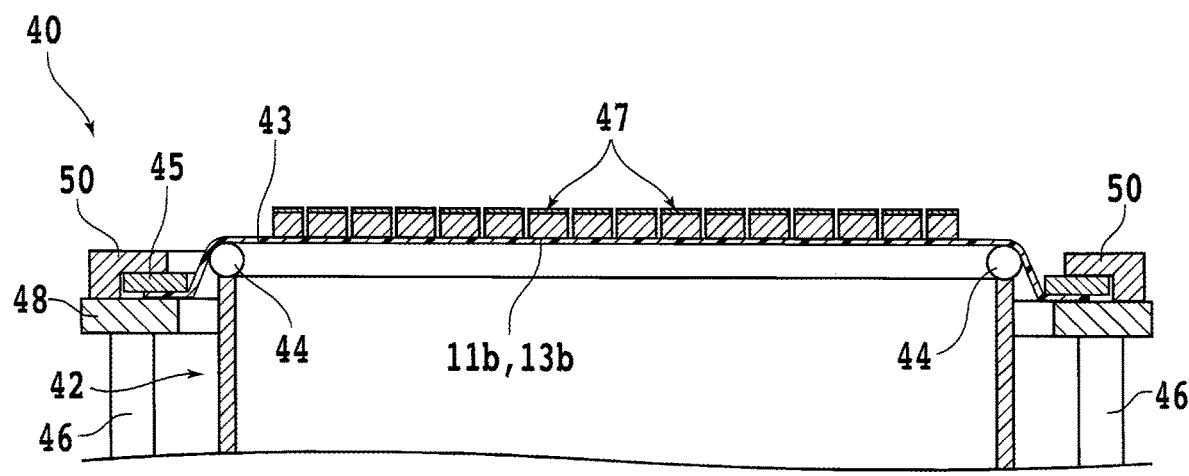
FIG. 10B is a partially sectional front view illustrating the expanding apparatus that expands a tape.

FIG. 10B is a partially sectional front view illustrating the expanding apparatus 40 that expands the tape 43. When the tape 43 is expanded, an external force is given to the wafer 11 to which the tape 43 is stuck. As a result, the substrate 13 is split with the cracks 39 being the origin. Further, the laser processed grooves 29b are formed in the stacked body 15 in the device region 21 (see FIG. 8B and so forth) of the wafer 11. Moreover, when the external force is given to the wafer 11, the laser processed grooves 29b function as the origin of dividing, and the stacked body 15 is split along the laser processed grooves 29b. When the substrate 13 and the stacked body 15 are each split along the planned dividing lines 17, the wafer 11 is divided into plural chips 47 each including the device 19 (see FIG. 1A and so forth). Then, the chips 47 are separated from the tape 43 and are picked up to be mounted on a predetermined mounting substrate, for example. Because a gap is formed between the chips 47 when the tape 43 is expended, it becomes easy to pick up the chips 47.

As above, in the present embodiment, the laser processed grooves 29 are formed along the planned dividing lines 17 by irradiation with the laser beam 12 before dividing of the wafer 11. Further, an irradiation condition of the laser beam 12 is set to cause melting of the stacked body 15 to occur more readily in the outer circumferential surplus region 23 than in the device region 21. According to the present embodiment, the laser processed grooves 29b with a depth that does not reach the substrate 13 are formed in the device region 21 of the wafer 11. Consequently, the laser processed grooves 29b that function as the origin of dividing of the stacked body 15 can be formed while lowering of the flexural strength of the chip 47 due to remaining of a processing mark in the substrate 13 is avoided. Further, in the outer circumferential surplus region 23 of the wafer 11, the laser processed grooves 29a deeper than the laser processed grooves 29b formed in the device region 21 are formed. This facilitates observation of the laser processed grooves 29a in the outer circumferential surplus region 23 from the side of the back surface 13b of the substrate 13, and position adjustment (alignment) between the wafer 11 and the laser beam 16 based on the position of the laser processed groove 29a becomes easy. As a result, it becomes possible to properly adjust the irradiation position of the laser beam 16 while suppressing lowering of the strength of the chip 47.

Note that structures, methods, and so forth according to the above-described embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of a wafer, comprising:
   a preparation step of preparing a wafer that includes a substrate and a stacked body disposed on a front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region; and
   a laser processed groove forming step of forming laser processed grooves along the planned dividing lines through executing irradiation with a first laser beam with a wavelength having absorbability with respect to the stacked body, along the planned dividing lines from a side of the stacked body of the wafer, wherein
   an irradiation condition of the first laser beam is set to cause melting of the stacked body to occur more readily in the outer circumferential surplus region than in the device region.

2. The manufacturing method of a wafer according to claim 1, wherein
   energy density of the first laser beam with which the outer circumferential surplus region is irradiated is higher than energy density of the first laser beam with which the device region is irradiated.

3. The manufacturing method of a wafer according to claim 1, wherein
   peak power of the first laser beam with which the outer circumferential surplus region is irradiated is higher than peak power of the first laser beam with which the device region is irradiated.

4. The manufacturing method of a wafer according to claim 1, wherein
   an overlap rate of the first laser beam with which the outer circumferential surplus region is irradiated is higher than an overlap rate of the first laser beam with which the device region is irradiated.

5. The manufacturing method of a wafer according to claim 1, wherein
   the laser processed grooves with a depth that does not reach the substrate are formed in the device region, and
   the laser processed grooves with a depth that reaches the substrate are formed in the outer circumferential surplus region.

6. A manufacturing method of a wafer, comprising:
   a preparation step of preparing a wafer that includes a substrate and a stacked body disposed on a front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region; and
   a laser processed groove forming step of forming laser processed grooves along the planned dividing lines through executing irradiation with a first laser beam with a wavelength having absorbability with respect to the stacked body, along the planned dividing lines from a side of the stacked body of the wafer, wherein
   the laser processed grooves formed in the outer circumferential surplus region are deeper than the laser processed grooves formed in the device region.

7. A manufacturing method of chips, comprising:
a preparation step of preparing a wafer that includes a substrate and a stacked body disposed on a front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region;
a laser processed groove forming step of forming laser processed grooves along the planned dividing lines through executing irradiation with a first laser beam with a wavelength having absorbability with respect to the stacked body, along the planned dividing lines from a side of the stacked body of the wafer;
a modified layer forming step of forming, after executing the laser processed groove forming step, modified layers along the planned dividing lines through positioning a focusing position of a second laser beam with a wavelength having transmissibility with respect to the substrate, to inside of the substrate, and executing irradiation with the second laser beam along the planned dividing lines from a back surface side of the substrate; and
a dividing step of giving, after executing the modified layer forming step, an external force to the wafer and dividing the wafer along the planned dividing lines, wherein
an irradiation condition of the first laser beam is set to cause melting of the stacked body to occur more readily in the outer circumferential surplus region than in the device region.

8. The manufacturing method of chips according to claim 7, wherein
energy density of the first laser beam with which the outer circumferential surplus region is irradiated is higher than energy density of the first laser beam with which the device region is irradiated.

9. The manufacturing method of chips according to claim 7, wherein
peak power of the first laser beam with which the outer circumferential surplus region is irradiated is higher than peak power of the first laser beam with which the device region is irradiated.

10. The manufacturing method of chips according to claim 7, wherein
an overlap rate of the first laser beam with which the outer circumferential surplus region is irradiated is higher than an overlap rate of the first laser beam with which the device region is irradiated.

11. The manufacturing method of chips according to claim 7, wherein
the laser processed grooves with a depth that does not reach the substrate are formed in the device region, and
the laser processed grooves with a depth that reaches the substrate are formed in the outer circumferential surplus region.

12. The manufacturing method of chips according to claim 7, further comprising:
a position adjustment step of observing, after executing the laser processed groove forming step but before executing the modified layer forming step, the laser processed groove formed in the outer circumferential surplus region from the back surface side of the substrate and adjusting a positional relation between the wafer and the second laser beam to cause a region that overlaps with the laser processed groove, to be irradiated with the second laser beam.

13. A manufacturing method of chips, comprising:
a preparation step of preparing a wafer that includes a substrate and a stacked body disposed on a front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region;
a laser processed groove forming step of forming laser processed grooves along the planned dividing lines through executing irradiation with a first laser beam with a wavelength having absorbability with respect to the stacked body, along the planned dividing lines from a side of the stacked body of the wafer;
a modified layer forming step of forming, after executing the laser processed groove forming step, modified layers along the planned dividing lines through positioning a focusing position of a second laser beam with a wavelength having transmissibility with respect to the substrate, to inside of the substrate, and executing irradiation with the second laser beam along the planned dividing lines from a back surface side of the substrate; and
a dividing step of giving, after executing the modified layer forming step, an external force to the wafer and dividing the wafer along the planned dividing lines, wherein
the laser processed grooves formed in the outer circumferential surplus region are deeper than the laser processed grooves formed in the device region.

14. A position adjustment method of a laser beam, comprising:
a grooved wafer preparation step of preparing a wafer that includes a substrate and a stacked body disposed on a front surface side of the substrate and that has a device region and an outer circumferential surplus region, the device region having a plurality of devices disposed in a plurality of regions marked out by a plurality of planned dividing lines arranged to intersect each other, the outer circumferential surplus region surrounding the device region, the stacked body having grooves formed therein along the planned dividing lines; and
a position adjustment step of observing the groove formed in the outer circumferential surplus region from a back surface side of the substrate and adjusting a positional relation between the wafer and the laser beam to cause a region that overlaps with the groove, to be irradiated with the laser beam, wherein
the grooves formed in the outer circumferential surplus region are deeper than the grooves formed in the device region.

15. The position adjustment method of a laser beam according to claim 14, wherein
the grooves with a depth that does not reach the substrate are formed in the device region, and
the grooves with a depth that reaches the substrate are formed in the outer circumferential surplus region.

* * * * *